United States Patent
Kim et al.

(10) Patent No.: US 7,807,584 B2
(45) Date of Patent: Oct. 5, 2010

(54) METHOD OF FORMING METALLIC OXIDE FILMS USING ATOMIC LAYER DEPOSITION

(75) Inventors: Ju-youn Kim, Suwon-si (KR); Seok-jun Won, Seoul (KR); Weon-hong Kim, Gyeonggi-do (KR); Min-woo Song, Seongnam-si (KR); Jung-min Park, Ansan-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 517 days.

(21) Appl. No.: 11/812,882

(22) Filed: Jun. 22, 2007

(65) Prior Publication Data

US 2008/0026596 A1 Jan. 31, 2008

(30) Foreign Application Priority Data

Jul. 26, 2006 (KR) ................... 10-2006-0070341

(51) Int. Cl.
*H01L 21/461* (2006.01)
(52) U.S. Cl. ................ 438/722; 438/104; 438/726; 438/763; 257/E21.159; 257/E21.17; 257/E21.28
(58) Field of Classification Search ............ 438/635, 438/722, 726, 771, 776; 257/E21.082, E21.104, 257/E21.113, E21.159, E21.161
See application file for complete search history.

(56) References Cited

U.S. PATENT DOCUMENTS 7,067,439 B2  6/2006  Metzner et al.

2003/0232511 A1* 12/2003 Metzner et al. ............. 438/785
2007/0237699 A1* 10/2007 Clark ......................... 423/263
2007/0252244 A1* 11/2007 Srividya et al. ............. 257/635

FOREIGN PATENT DOCUMENTS

| KR | 10-2001-0036268 A | 5/2001 |
| KR | 10-2002-0064126 A | 8/2002 |
| KR | 10-2005-0019382 A | 3/2005 |
| KR | 10-2006-0001118 A | 6/2006 |
| KR | 10-2006-0001123 A | 6/2006 |

OTHER PUBLICATIONS

Notice of Allowance dated Oct. 23, 2007 for corresponding Korean Patent Application No. 10-2006-0070341.

* cited by examiner

*Primary Examiner*—Charles D Garber
*Assistant Examiner*—Cheung Lee
(74) *Attorney, Agent, or Firm*—Harness, Dickey & Pierce, P.L.C.

(57) ABSTRACT

Example embodiments are directed to methods of forming a metallic oxide film using Atomic Layer Deposition while controlling the power reflected by a reactor. The method may include feeding metallic source gases, for example, first and second metallic source gases, and/or a reactant gas including oxygen into the reactor individually. One of the metallic source gases may include an amino-group or an alkoxy-group and another metallic source gas may include neither an amino-group nor an alkoxy-group. A plasma may be produced in the reactor from the reactant gas.

8 Claims, 8 Drawing Sheets

FIG.3
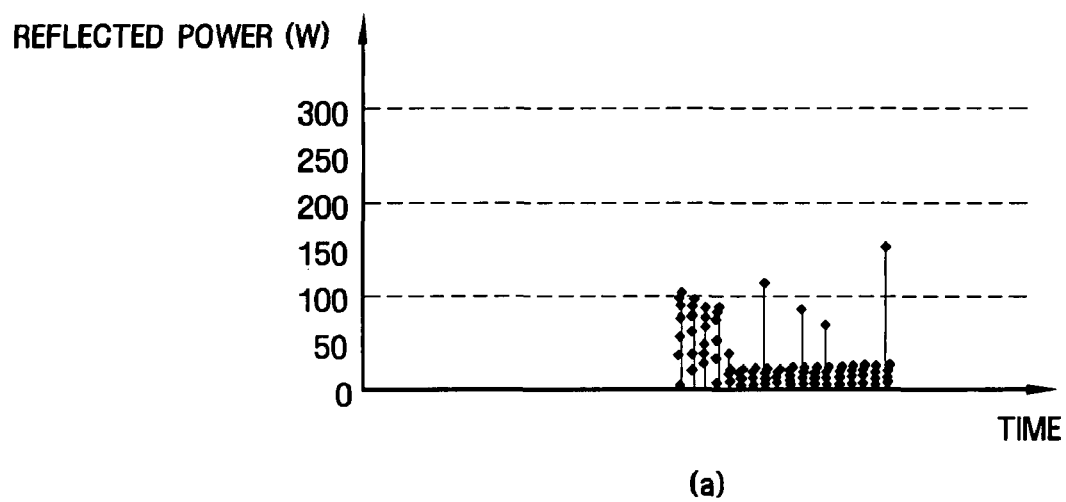
(a)
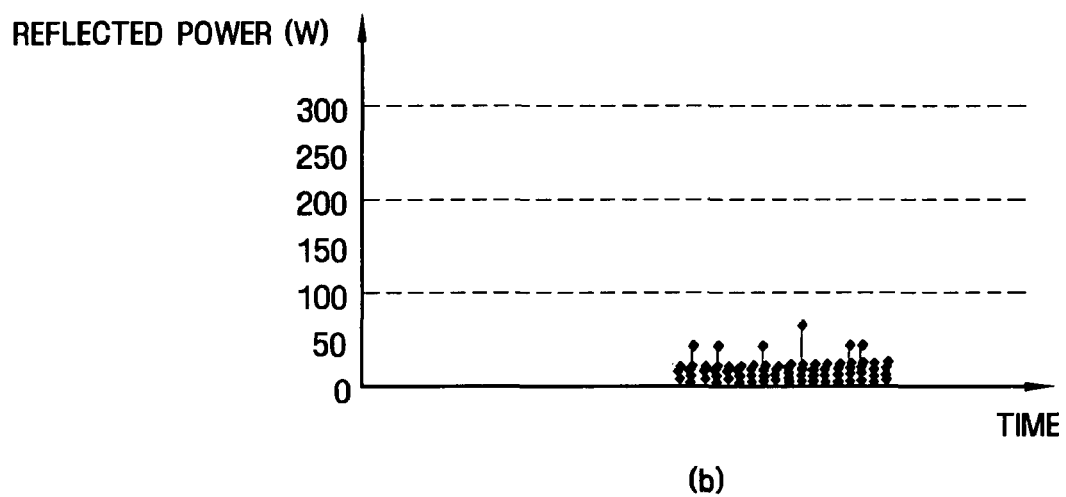
(b)

FIG.7
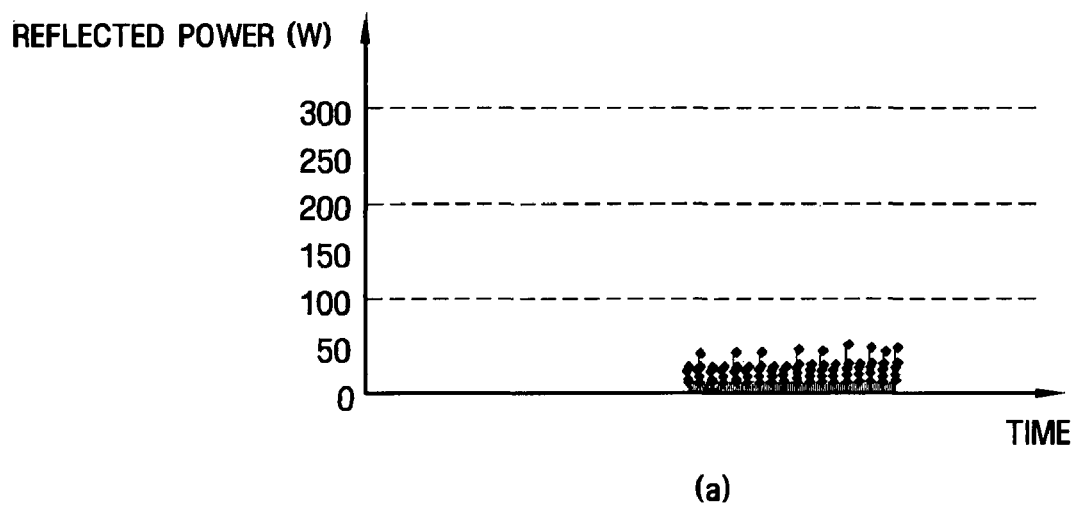
(a)
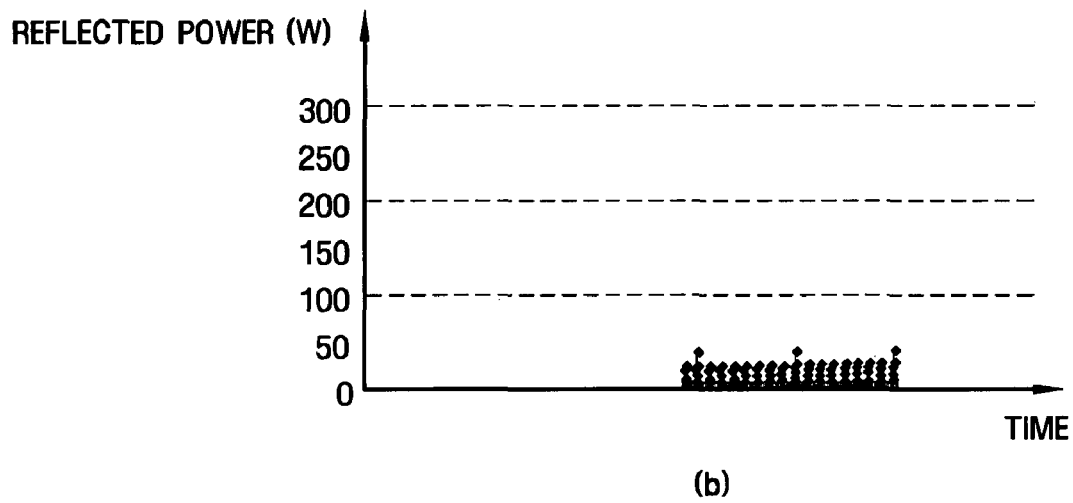
(b)

METHOD OF FORMING METALLIC OXIDE FILMS USING ATOMIC LAYER DEPOSITION

PRIORITY STATEMENT

This application claims priority under 35 U.S.C. §119 to Korean Patent Application No. 10-2006-70341 filed on Jul. 26, 2006 in the Korean Intellectual Property Office, the entire contents of which are incorporated herein by reference.

BACKGROUND

1. Field

Example embodiments are directed to a method of forming metallic oxide films, for example, a method of forming metallic oxide films using Atomic Layer Deposition.

2. Description of Related Art

Methods of forming thin films, for example, PVD (Physical Vapor Deposition), CVD (Chemical Vapor Deposition), and ALD (Atomic Layer Deposition), may be used to form thin films on semiconductor substrates.

Whereas several conventional methods may supply multiple gases at one time, ALD may be used to form thin films by supplying gases in the form of individual pulses at given intervals. For example, a thin film having roughly an atomic thickness may be formed by alternately supplying a source gas and a purge gas, and a reactant gas and a purge gas. The ALD may provide beneficial step coverage and uniformity even on a large substrate. Furthermore, the thickness of the thin film may be adjusted by controlling the number of cycle repetitions.

In addition to conventional ALD, PEALD (Plasma Enhanced Atomic Layer Deposition) may be used for forming thin films by changing a reactant gas into a plasma state. PEALD may be advantageous because of beneficial deposition rates and electrical properties, and may allow deposition of a variety of substances.

In PEALD, plasma power may be supplied to produce a plasma. High frequency power for producing a plasma may be supplied from a high frequency power source through an impedance matching box, for example. Reflected power not absorbed into the plasma may be detected and reflected to the high frequency power source. Accordingly, plasma power may be supplied in consideration of the reflected power.

As the magnitude of reflected power becomes relatively small and/or uniform, it may become easier to control the plasma power. When the magnitude of reflected power becomes relatively large and/or non-uniform, it may be more difficult to control the plasma power, and the plasma production may become unstable.

SUMMARY

A method of forming a metallic oxide film using Atomic Layer Deposition while controlling the power reflected by a reactor according to example embodiments may include feeding metallic source gases and/or a reactant gas into the reactor individually, where the reactor includes a substrate therein. At least one of the metallic source gases may include at least one of an amino-group and an alkoxy-group, at least one other of the metallic source gases may include neither an amino-group nor an alkoxy-group, and the reactant gas may include oxygen. A plasma may be produced in the reactor from the reactant gas. The reflected power may be relatively low or relatively uniform.

For example, a first metallic source gas may including neither an amino-group nor an alkoxy-group may be fed into the reactor before a second metallic source gas including at least one of an amino-group and an alkoxy-group. The first metallic source gas may include TEMAH, TDEAH, TDMAH, TEMAZ, TDEAZ, TDMAZ, TDMAT, TDEAT, TEMAT, PEMAT, PDMAT, PDEAT, and/or TBTDET. The second metallic source gas may include TMA, DMAH, DMAH-EPP, and/or DMAP. A method according to example embodiments may also include purging at least one of the first metallic source gas and the second metallic source gas before feeding additional gases into the reactor.

Producing the plasma in the reactor from the reactant gas may include supplying plasma power to the reactor, and the reactant gas may be purged after producing the plasma. The plasma power may be supplied to the reactor concurrently with feeding the reactant gas into the reactor, and the reactant gas may be purged after the plasma is produced.

Alternatively, a first metallic source gas including at least one of an amino-group and an alkoxy-group may be fed into the reactor before a second metallic source gas including neither an amino-group nor an alkoxy-group. The first metallic source gas may include TMA, DMAH, DMAH-EPP, and/or DMAP. The second metallic source gas may include TEMAH, TDEAH, TDMAH, TEMAZ, TDEAZ, TDMAZ, TDMAT, TDEAT, TEMAT, PEMAT, PDMAT, PDEAT, and/or TBTDET. A method according to example embodiments may also include purging at least one of the first metallic source gas and the second metallic source gas before feeding additional gases into the reactor.

Producing the plasma in the reactor from the reactant gas may include supplying plasma power to the reactor, and the reactant gas may be purged after producing the plasma. The plasma power may be supplied to the reactor concurrently with feeding the reactant gas into the reactor, and the reactant gas may be purged after the plasma is produced.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIGS. 3(a) and 3(b) are graphs illustrating example reflected power data.

FIGS. 7(a) and 7(b) are graphs illustrating example reflected power data.

DESCRIPTION OF EXAMPLE EMBODIMENTS

Figure 1:
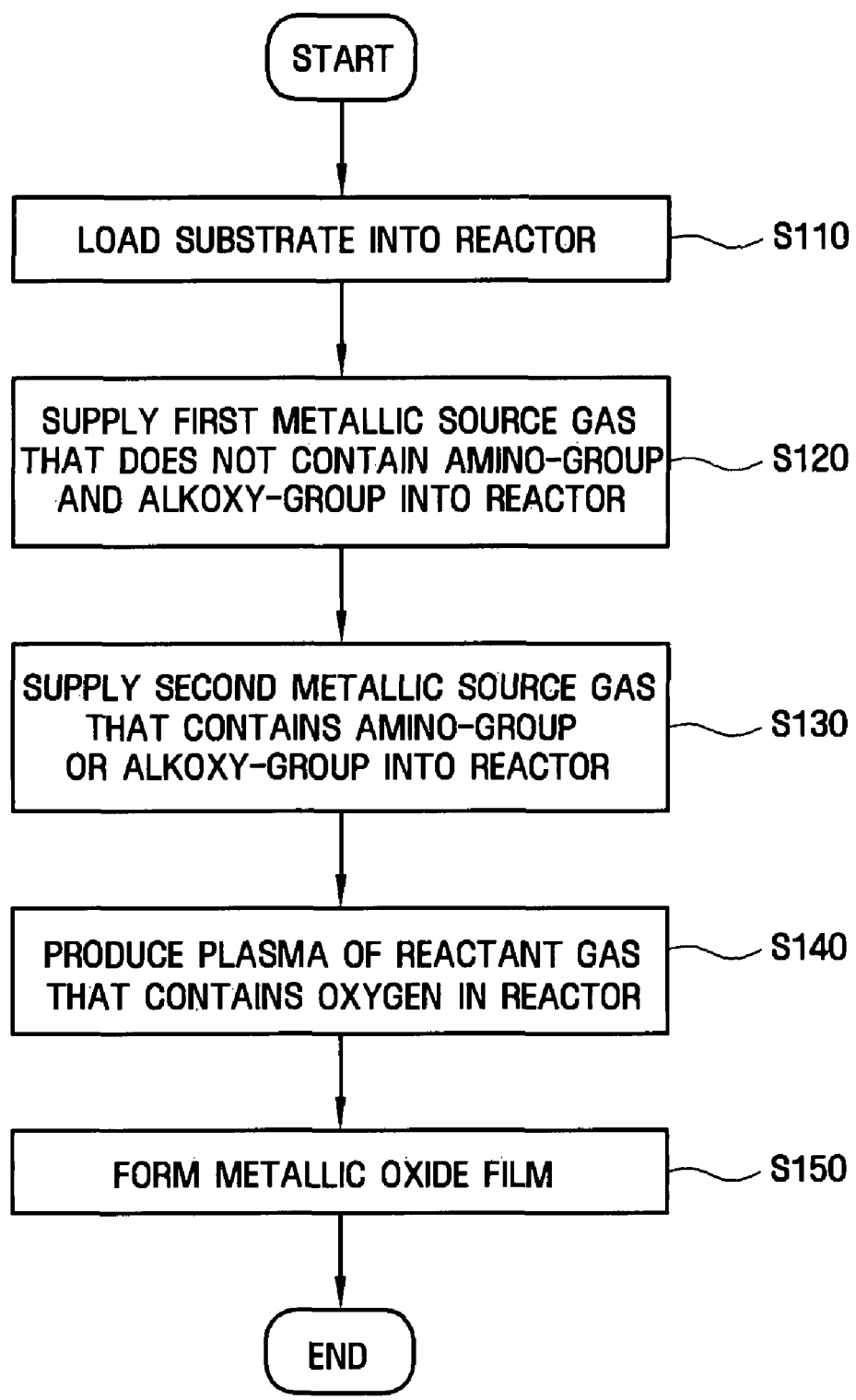
FIG. 1 is a flowchart illustrating a method of forming a metallic oxide film using ALD according to an example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
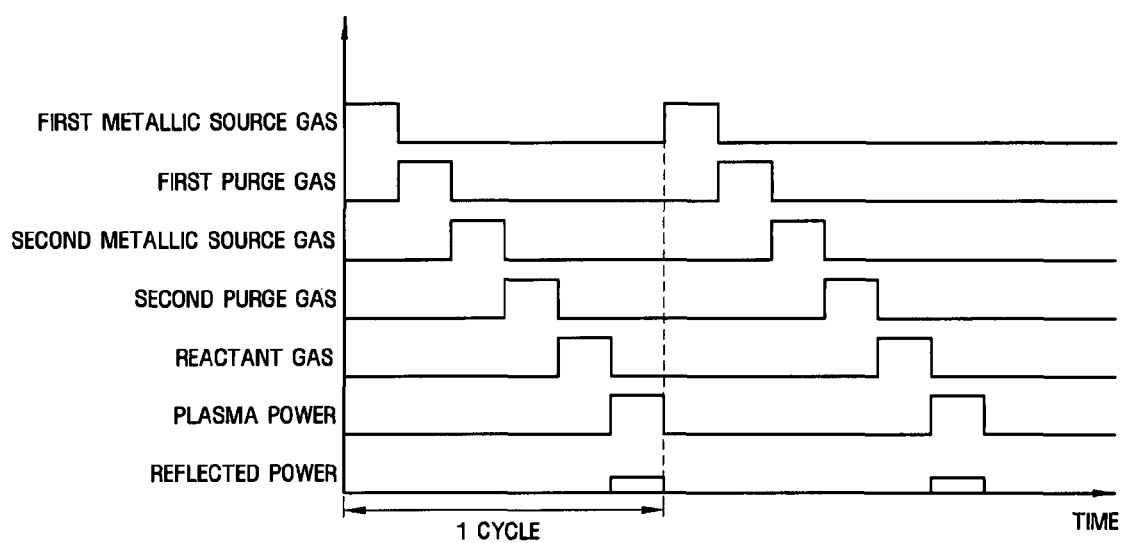
FIG. 2 is a timing chart illustrating the method of forming the metallic oxide film using ALD of FIG. 1.

FIG. 1 is a flowchart illustrating a method of forming a metallic oxide film using ALD according to an example embodiment. FIG. 2 is a timing chart illustrating the method of forming the metallic oxide film using ALD of FIG. 1.

Referring to FIGS. 1 and 2, a substrate may be loaded into a reactor (S110) and a first metallic source gas not including an amino group or an alkoxy group may be fed into the reactor (S120). The substrate may be a three-dimensional structure, for example, a structure having a deep hole, such as a lower electrode of a cylindrical capacitor or the like.

The first metallic source gas may be determined based on the desired metallic oxide film. For example, the first metallic source gas may be a compound including the metal of the desired metallic oxide film. However, according to an example embodiment, the first metallic source gas may not contain an amino-group or an alkoxy-group. For example, if an aluminum metallic oxide film is formed according to an example embodiment, the first metallic source gas may be TMA (TriMethyl Aluminum), DMAH (DiMethyl Aluminum Hydride), DMAH-EPP (DiMethyl Aluminum Hydride-Ethyl PiPeridine), DMAP (DiMethyl Aluminum Peridine), a combination thereof, or the like.

When a first metallic source gas is supplied to the reactor for a given amount of time, part of it may react with or be chemically absorbed onto the substrate surface, and another part may be physically absorbed onto the surface of the reacted or chemically absorbed part, or simply remain in gaseous form inside the reactor. An inert gas may also be supplied together with the first metallic source gas. The inert gas may be, for example, Ar, He, Kr, Xe, a combination thereof, or the like. The part of the first metallic source gas not having reacted with the substrate may be purged by supplying a first purge gas, for example, an inert gas.

A second metallic source gas including an amino-group or an alkoxy-group may be supplied into the reactor (S130). The second metallic source gas may be, for example, TMA (Tri Methyl Aluminum), DMAH (Di Methyl Aluminum Hydride), DMAH-EPP (DiMethyl Aluminum Hydride Ethyl PiPeridine), TEMAH (Tetrakis EthylMethylAmino Hafnium), TDEAH (Tetrakis DiEthylAmino Hafnium), TDMAH (Tetrakis DiMethylAmino Hafnium), TEMAZ (Tetrakis EthylMethylAmino Zirconium), TDEAZ (Tetrakis DiEthylAmino Zirconium), TDMAZ (Tetrakis DiMethylAmino Zirconium), TDMAT (Tetrakis DiMethylAmino Titanium), TDEAT (Tetrakis DiEthylAmino Titanium), TEMAT (Tetrakis EthylMethylAmino Titanium), PEMAT (Pentakis EthylMethylAmino Tantalum), PDMAT (Petakis DiMethylAmino Tantalum), PDEAT (Pentakis DiEthylAmino Tantalum), TBTDET (Tert-Butylimido-Tris-Diethylamino Tantalum), a combination thereof, or the like. Alternatively, Zr-t butoxide or Hf-t butoxide may be used for the second metallic source gas.

The second metallic source gas may also be purged, by supplying a second purge gas, for example, an inert gas.

A plasma may be produced in the reactor from a reactant gas containing oxygen (S140), by, for example, feeding the reactant gas including oxygen into the reactor and applying a plasma producing power signal (plasma power). Some of the plasma power may be reflected by the reactor (reflected power), and the plasma power magnitude may be adjusted in consideration of the reflected power. For example, the plasma power may be controlled by an impedance matching box or the like. The oxide reactant gas may be purged after the plasma has been produced.

The metallic oxide film may be formed by repeating the above described process to adjust the thickness, uniformity, and other characteristics of the film as needed (S150). The metallic oxide film may be composed mainly of the first metal of the first metallic source gas and not include the second metal of the second metallic source gas, or may contain relatively little of the second metal as compared to the first metal.

By supplying the second metallic source gas including an amino-group or an alkoxy-group after the first metallic source gas not including an amino-group or an alkoxy-group, the reflected power may be reduced and/or made more uniform. Thus, the plasma power may be more readily controlled, and the plasma may be produced with greater stability and safety.

FIGS. 3(a) and 3(b) show example graphs illustrating reflected power data. FIG. 3(a) shows example reflected power data when the second metallic source gas including an amino-group or an alkoxy-group is not used before applying the plasma power (first metallic source gas only), and FIG. 3(b) shows example reflected power data when the second metallic source gas including an amino-group or an alkoxy-group is used before applying the plasma power (first and second metallic source gases). In the example graphs of FIG. 3, the first metallic source gas is TMA containing aluminum, the second metallic source gas is TEMAH containing hafnium, the reactant gas is $O_2$, and the plasma power applied is 600 W. As shown, the uniformity of the reflected power may be improved and the magnitude of reflected power may be reduced.

Figure 4:
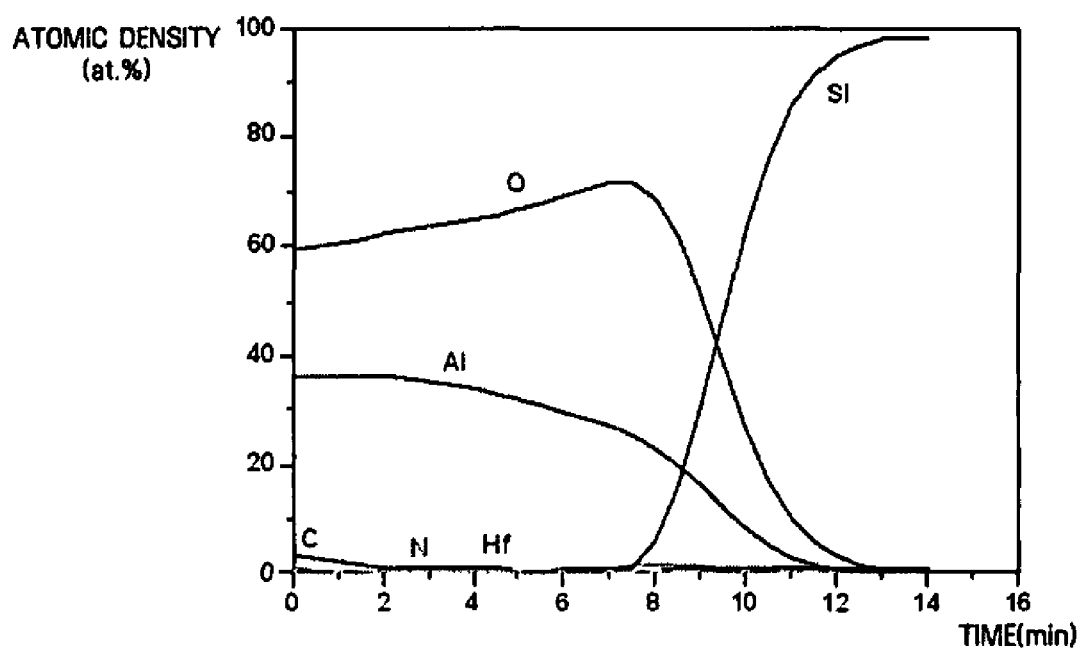
FIG. 4 is a graph illustrating example Auger Electron Spectroscopy analysis data of a metallic oxide film formed according to an example embodiment.

FIG. 4 is an example graph illustrating AES (Auger Electron Spectroscopy) analysis results of a first metallic oxide film formed by a method of forming a metallic oxide film using ALD according to an example embodiment. The example analysis shown in FIG. 4 was performed using a first metallic source gas of TMA containing aluminum and a second metallic source gas of TEMAH containing hafnium.

As shown in FIG. 4, the first metallic oxide film may include significant amounts of the first metal aluminum, but relatively little amounts of the second metal hafnium.

Figure 5:
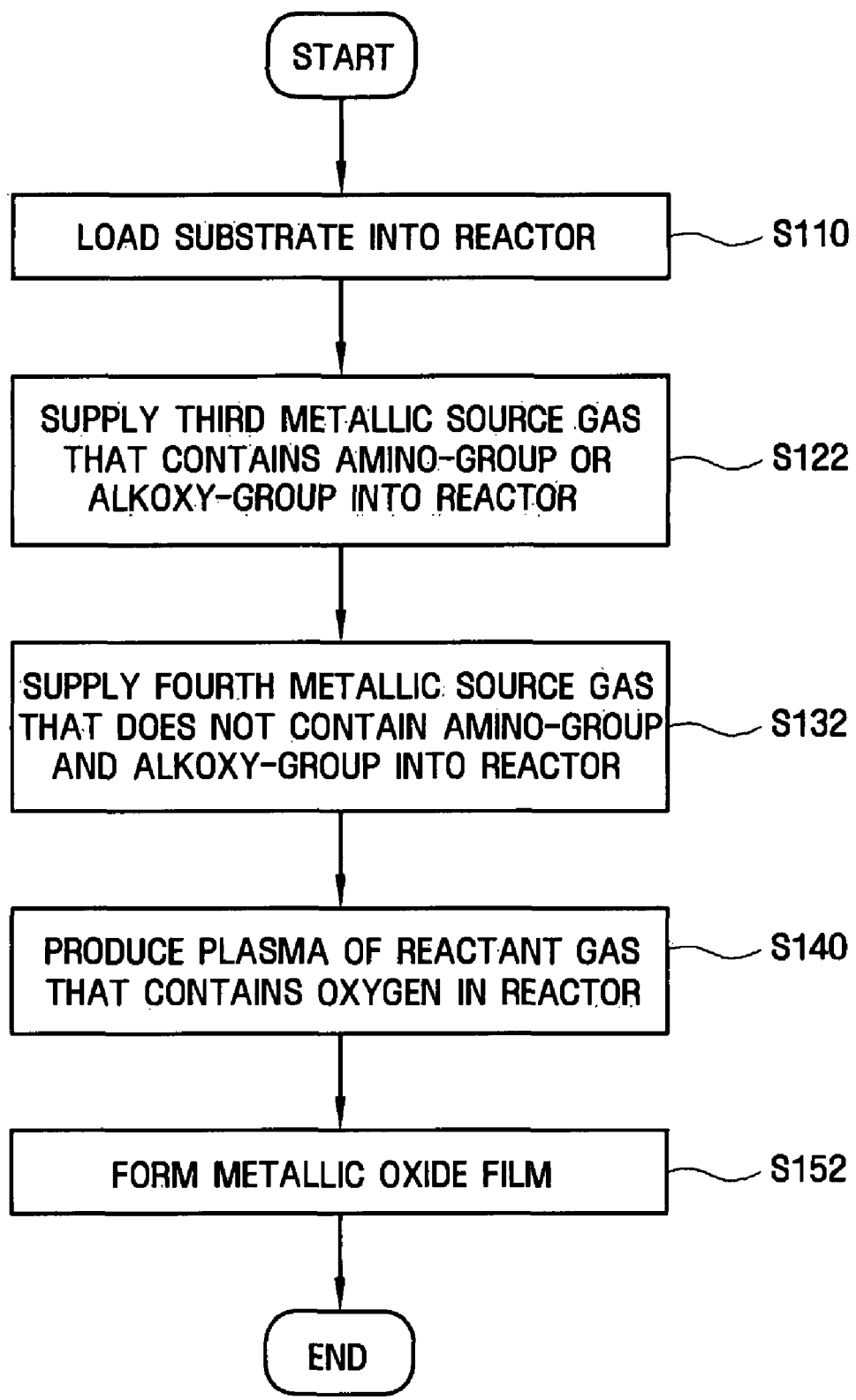
FIG. 5 is a flowchart illustrating a method of forming a metallic oxide film using ALD according to an example embodiment.
Figure 6:
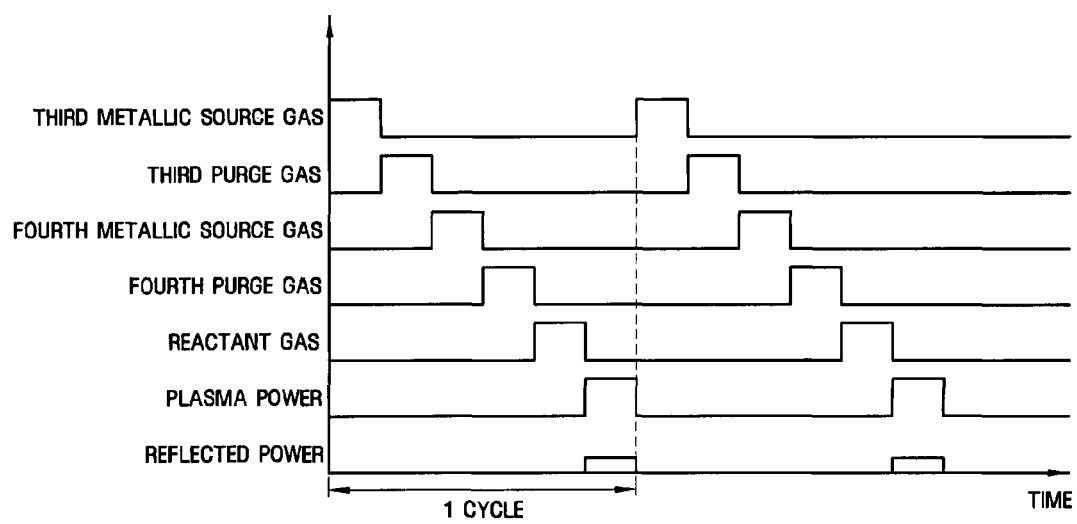
FIG. 6 is a timing chart illustrating the method of forming a metallic oxide film using ALD of FIG. 5.

FIGS. 5 and 6 illustrate a flow chart and a timing chart, respectively, for a method of forming a metallic oxide film using ALD according to an example embodiment.

Referring to FIGS. 5 and 6, a substrate may be loaded into a reactor (S110) and a third metallic source gas including an amino-group or an alkoxy-group may be fed into the reactor (S122). The substrate may be a three-dimensional structure, for example, a deep hole, such as a lower electrode of a cylindrical capacitor.

The third metallic source gas may be determined based on the desired composition of the metallic oxide film, for example, a compound with the metal of the desired metallic oxide film. However, the third metallic source gas may also include an amino-group or an alkoxy-group. The desired oxide film may be, for example, a hafnium oxide film, a zirconium oxide film, an aluminum oxide film, a titanium oxide film, a tantalum oxide film, or the like.

If an aluminum oxide film is desired, the third metallic source gas may be, for example, TMA (Tri Methyl Aluminum), DMAH (Di Methyl Aluminum Hydride), DMAH-EPP (DiMethyl Aluminum Hydride Ethyl PiPeridine), a combination thereof, or the like. If a hafnium oxide film is desired, the third metallic source gas may be, for example, TEMAH (Tetrakis EthylMethylAmino Hafnium), TDEAH (Tetrakis DiEthylAmino Hafnium), TDMAH (Tetrakis DiMethylAmino Hafnium), a combination thereof, or the like. If a zirconium oxide film is desired, the third metallic source gas may be, for example, TEMAZ (Tetrakis EthylMethylAmino Zirconium), TDEAZ (Tetrakis DiEthylAmino Zirconium), TDMAZ (Tetrakis DiMethylAmino Zirconium), a combination thereof, or the like. If a titanium oxide film is desired, the third metallic source gas may be, for example, TDMAT (Tetrakis DiMethylAmino Titanium), TDEAT (Tetrakis DiEthylAmino Titanium), TEMAT (Tetrakis EthylMethylAmino Titanium), a combination thereof, or the like. If a tantalum oxide film is desired, the third metallic source gas may be, for example, PEMAT (Pentakis EthylMethylAmino Tantalum), PDMAT (Petakis DiMethylAmino Tantalum), PDEAT (pentakis DiEthylAmino Tantalum), TBTDET (Tert-Butylimido-Tris-Diethylamino Tantalum), a combination thereof, or the like. Alternatively, Zr-t butoxide or Hf-t butoxide may be used. An inert gas may be supplied together with the third metallic source gas. The inert gas may be, for example, Ar, He, Kr, Xe, a combination thereof, or the like.

When the third metallic source gas is fed into the reactor for a given amount of time, part of it may react with the substrate surface or be chemically absorbed onto the surface, and another part may be physically absorbed onto the reacted or chemically absorbed surface of the third metallic source gas, or remain inside the reactor in gaseous form. The third metallic source gas that remains without reacting with the substrate may be purged, for example, by supplying a first purge gas, which may be an inert gas.

A fourth metallic source gas not including an amino-group or an alkoxy-group may be fed into the reactor (S132). The fourth metallic source gas may be, for example, TMA (Tri Methyl Aluminum), DMAH (Di Methyl Aluminum Hydride), DMAH-EPP (DiMethyl Aluminum Hydride Ethyl PiPeridine), DMAP (DiMethyl Aluminum Peridine), a combination thereof, or the like. The fourth metallic source gas may be purged, for example, by supplying a fourth purge gas, which may be an inert gas.

A plasma may be produced in the reactor from a reactant gas including oxygen (S140). For example, the reactant gas including oxygen may be fed into the reactor and the plasma from the reactant gas may be produced by supplying plasma power to the reactor. As described above, some of the plasma power may be reflected by the reactor as reflected power, and the plasma power may be adjusted to the appropriate magnitude in consideration of the reflected power. For example, the plasma power may be controlled by an impedance matching box or the like.

The reactant gas may be purged after the plasma power is applied. The second metallic oxide film may be formed by repeating the above process to adjust the thickness, uniformity, and other characteristics of the film as needed (S152). The metallic oxide film formed may contain the third metal included in the third metallic source gas and the fourth metal included in the fourth metallic source gas. The amount of the third metal may be significantly larger than the amount of the fourth metal.

When the fourth metallic source gas not including an amino-group or an alkoxy-group is fed into the reactor after the third metallic source gas including an amino-group or an alkoxy-group, and a plasma produced as described above, the reflected power may be reduced and/or made more uniform. Thus, the plasma power may be more readily controlled, and the plasma may be produced with greater stability and safety.

FIG. 7 illustrates example graphs of reflected power data. FIG. 7(a) shows example reflected power data when only the third metallic source gas including an amino-group or an alkoxy-group is fed into the reactor before the plasma power is applied, and FIG. 7(b) shows example reflected power data when the fourth metallic source gas not including an amino-group or an alkoxy-group is also fed into the reactor before the plasma power is applied. The example reflected power data of FIG. 7 corresponds to a third metallic source gas of TEMAH including hafnium, a fourth metallic source gas of TMA including aluminum, a reactant gas of $O_2$, and a plasma power of 600 W. As shown, the uniformity of the reflected power may be improved and the magnitude of the reflected power may be reduced.

Figure 8:
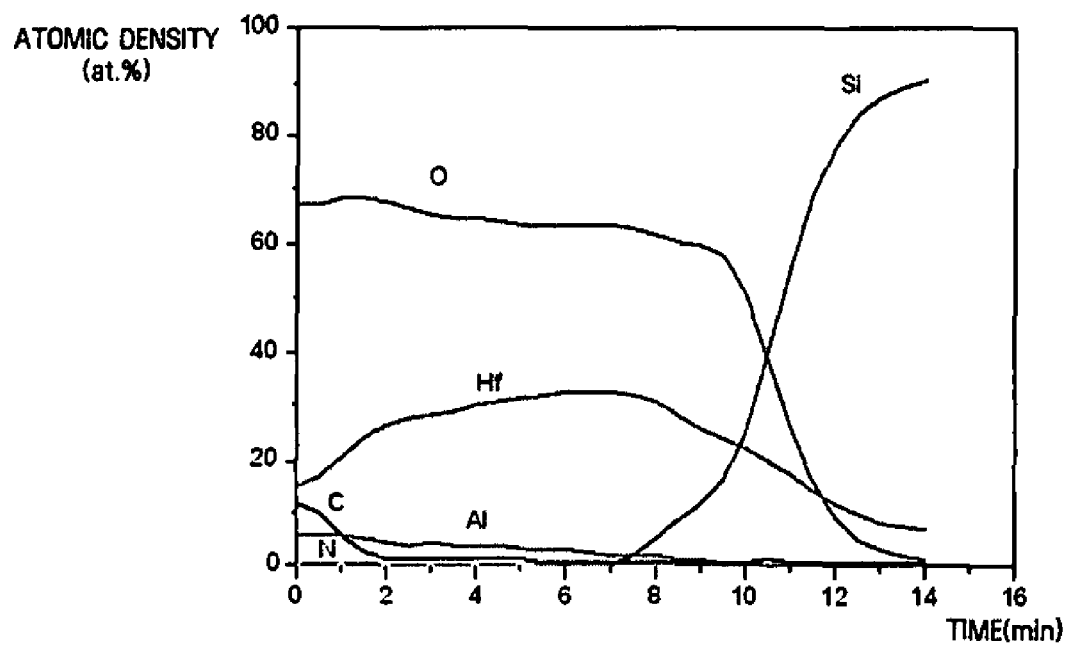
FIG. 8 is a graph illustrating example Auger Electron Spectroscopy analysis data of a metallic oxide film formed according to an example embodiment.

FIG. 8 is a graph illustrating an AES analysis of an example metallic oxide film formed according to the method of FIG. 5. The example metallic oxide file was formed using a third metallic source gas of TEMAH including hafnium and a fourth metallic source gas of TMA including aluminum. As seen from FIG. 8, the oxide film may contain a relatively large amount of hafnium (the third metal) and a relatively small amount of aluminum (the fourth metal).

Thus, the reflected power may be reduced and/or made more uniform, and the plasma power may be more readily controlled with greater stability and safety in forming a metallic oxide film using ALD according to example embodiments.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of forming a metallic oxide film using Atomic Layer Deposition while controlling the power reflected by a reactor, comprising:
   feeding metallic source gases and a reactant gas into the reactor individually, the reactor including a substrate therein; and
   producing a plasma in the reactor from the reactant gas, wherein
   at least one of the metallic source gases includes at least one of an amino-group and an alkoxy-group, at least one other of the metallic source gases includes neither an amino-group nor an alkoxy-group, and the reactant gas includes oxygen, and
   the reflected power is relatively uniform,
   wherein a first metallic source gas including neither an amino-group nor an alkoxy-group is fed into the reactor before a second metallic source gas including at least one of an amino-group and an alkoxy-group, and the metallic oxide film does not include metal from the second metallic source gas.

2. The method of claim 1, wherein the second metallic source gas includes TEMAH, TDEAH, TDMAH, TEMAZ, TDEAZ, TDMAZ, TDMAT, TDEAT, TEMAT, PEMAT, PDMAT, PDEAT, or TBTDET.

3. The method of claim 1, wherein the first metallic source gas includes TMA, DMAH, DMAH-EPP, or DMAP.

4. The method of claim 1, further comprising:
   purging at least one of the first metallic source gas and the second metallic source gas before feeding additional gases into the reactor.

5. The method of claim 1, wherein producing the plasma in the reactor from the reactant gas includes supplying plasma power to the reactor.

6. The method of claim 5, further comprising:
   purging the reactant gas after producing the plasma.

7. The method of claim 5, wherein the plasma power is supplied to the reactor concurrently with feeding the reactant gas into the reactor.

8. The method of claim 7, further comprising:
   purging the reactant gas after producing the plasma.

* * * * *